US006838694B2

(12) United States Patent
Esteve et al.

(10) Patent No.: US 6,838,694 B2
(45) Date of Patent: Jan. 4, 2005

(54) SUPERCONDUCTING QUANTUM-BIT DEVICE BASED ON JOSEPHSON JUNCTIONS

(75) Inventors: Daniel Esteve, Viroflay (FR); Denis Vion, Gif sur Yvette (FR); Michel Devoret, Paris (FR); Cristian Urbina, Gif sur Yvette (FR); Philippe Joyez, Orsay (FR); Hughes Pothier, Paris (FR); Pierre-Francois Orfila, Palaiseau (FR); Abdelhahim Aassime, Massy (FR); Audrey Cottet, Palaiseau (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 10/244,634

(22) Filed: Sep. 16, 2002

(65) Prior Publication Data

US 2003/0207766 A1 Nov. 6, 2003

(30) Foreign Application Priority Data

May 3, 2002 (FR) ............................................ 02 05599

(51) Int. Cl.$^7$ .............................................. H01L 29/06
(52) U.S. Cl. .............................. 257/34; 257/9; 257/31; 257/663; 257/200
(58) Field of Search ............................... 257/9, 31, 34, 257/663, 200, 32, 33

(56) References Cited

U.S. PATENT DOCUMENTS 6,605,822 B1 * 8/2003 Blais et al. .................... 257/34

FOREIGN PATENT DOCUMENTS

WO    WO 01/50534 A2    7/2001
WO    WO 02/15290 A1    2/2002

OTHER PUBLICATIONS

A. Cottet, et al., "Implementation of a combined charge–phase quantum bit in a superconducting circuit", Physica C, vol. 367. No. 1–4, Feb. 15, 2002, pp. 197–203.
A. B. Zorin, "Cooper–pair qubit and Cooper–pair electrometer in one device", Physica C, vol. 368, No. 1–4, Mar. 1, 2002, pp. 284–288.
"Quantum Coherence with a Single Cooper Pair", V. Bouchiat, et al., Physica Scripta, T76, (1998), pp. 165–170.
"Coherent Control of Macroscopic Quantum States in a Single–Cooper–Pair Box", Y. Nakamura, et al., NEC Fundamental Research Laboratories, Nature, vol. 398, Apr. 29, 1999, pp. 786–788.
"Josephson Persistent–Current Qubit", J.E. Mooij, et al., Science, vol. 285, Aug. 13, 1999, pp 1036–1039.
"Quantum Superposition of Macroscopic Persistent–Current States", C. van der Wal, et al., Science, vol. 290, Oct. 27, 2000, pp. 773–777.

* cited by examiner

*Primary Examiner*—Nathan J. Flynn
*Assistant Examiner*—Scott R. Wilson
(74) *Attorney, Agent, or Firm*—Weingarten, Schurgin, Gagenbin & Lebovici LLP

(57) ABSTRACT

A superconducting quantum-bit device based on Josephson junction has a charge as a first principal degree of freedom assigned to writing and a phase as a second principal degree of freedom assigned to reading. The device comprises a Cooper-pair box comprising first and second Josephson junctions defining a charge island of the Cooper-pair box closing up onto a superconducting loop. A read circuit comprises a read Josephson junction $J_L$ inserted into the superconducting loop and having a Josephson energy $E_j$ at least 50 times greater than the Josephson energy of each of the first and second Josephson junctions.

15 Claims, 5 Drawing Sheets

SUPERCONDUCTING QUANTUM-BIT DEVICE BASED ON JOSEPHSON JUNCTIONS

FIELD OF THE INVENTION

The subject of the present invention is a superconducting quantum-bit device based on Josephson junctions. The present invention falls within the field of quantum computing and constitutes one way of producing the elementary component called "quantum bit", also called qubit. This component is a physical device having only two quantum states (for example the rest state and the excited state) which will conventionally be denoted by the state vectors |0> and |1>, it being possible for this component to be placed in a coherent superposition of these states, this superposition being denoted by:

$$a|0> + b|1>$$

where the coefficients a and b may take arbitrary values respecting the normalization of the state.

In order for a qubit to be used for quantum computing, it is necessary:

a) for its quantum state to be able to be arbitrarily manipulated by an external control (execution of the group of unitary SU(2) operations, where SU(2) represents the state space of the qubit). Thus, it is especially necessary to be able to prepare any coherent superposition $a|0> + b|1>$ of the two quantum states of the qubit (write phase);

b) for this quantum state to be able to be read faithfully (read phase); and c) for the qubit to have a coherence time long enough to allow manipulation of this state and coupling with one or more other qubits in order to produce logic gates (computing phase).

Qubits satisfying the above conditions a, b and c are intended, in a subsequent phase, to be coupled together and combined so as to physically carry out logic operations in order to be used in quantum processors.

Current qubits are of two types:

1) those of the first type are based on naturally quantum objects, such as atoms, ions, or nuclear spins. Their coherence time is a priori long (several seconds); on the other hand, interconnection with other quantum bits is delicate to implement and integration into a single device of a sufficient number of qubits in order to perform calculations seems barely realistic in the current state of knowledge;

2) those of the second type are based on fabricated objects, generally using microtechnologies or nanotechnologies, such as superconducting electrical circuits. Their coherence time is a priori shorter, but on the other hand interconnection with other quantum bits is more favourable. This is because integration of a large number of qubits on a single substrate should benefit from the experience of microfabrication required on electronic components.

The invention belongs to this second type and relates to a nanofabricated qubit, essentially consisting of an electrical circuit made of an S-type superconducting material based on Josephson junctions. Such qubits are intended to be electromagnetically coupled together and integrated into a microfabricated circuit so as to physically carry out logic operations, and then later still to produce quantum electronic processors.

It will be reminded that a Josephson junction is characterized by two parameters set at its fabrication, especially by its dimensions: one is the Josephson energy $E_J$, which corresponds to the coupling between the superconducting electrodes, and the other is the Coulomb energy $E_c = 2e^2/C_j$ which corresponds to the electrostatic energy needed to store a Cooper pair on the capacitor $C_j$ of the junction. For a system based on several Josephson junctions, it is possible to define a Josephson energy and a Coulomb energy which are effective for each branch or island of the circuit.

A junction is a physical system having a single degree of freedom: the superconducting phase difference at its terminals, a variable conjugate with the number of Cooper pairs having passed through it. A junction may be in a phase regime or a charge regime, depending on the value of the effective ratio $E_J/E_C$ of the circuit to which this junction belongs. A multijunction circuit therefore has several degrees of freedom, but the degrees called principal degrees, which are active, are distinguished from the others, which are ineffective.

PRIOR ART

Existing superconducting qubit circuits based on Josephson junctions have a principal degree of freedom which is either an electrical charge (the number of Cooper pairs in a part of the circuit) or a superconducting phase difference δ at the terminals of one or more Josephson junctions (or the current which results therefrom).

Simplistically, the charge or phase nature of the principal degree of freedom is essentially determined by the ratio of the Josephson energy $E_J$ of the junctions of the qubit to their Coulomb energy $E_C$. When this ratio is less than unity, the principal degree of freedom is a charge, when it is greater than about ten, the principal degree of freedom is a phase. In the intermediate situation, both charge and phase characters appear depending on the circuit.

The most widely known of the circuits whose quantum behaviour is based on a charge is the "Cooper-pair box" described for the first time in the document "Quantum coherence with a single Cooper pair" by V. Bouchiat, D. Vion, P. Joyez, D. Esteve and M. H. Devoret, Physica Scripta, T76, 165 (1998). It has since become well known to those skilled in the art, and we will restrict ourselves to recalling that a Cooper-pair box comprises a superconducting circuit portion which is insulated from the rest of the circuit by one or more insulating materials (or by a vacuum) and is coupled to the rest of the circuit via at least one Josephson junction. FIG. 1 shows schematically such a circuit portion 10, called an island, between the insulator 11 of the Josephson junction and the insulator of a series-connected capacitor 13, whose capacitance is $C_g$, and the other end of which is connected to a bias voltage source 12 of value $V_g$. This capacitor 13 causes capacitive coupling between the island and the adjustable DC bias voltage source 12, which determines the point of operation of the circuit. The quantum states of the island are superposed by a suitable sequence of DC or radiofrequency pulses applied either to the same capacitor 13 or to another electrode, also capacitively coupled to the island. The major problem with such a device resides in the existence of electrical charges, which fluctuate erratically, in the immediate vicinity of the island. This charge "noise" reduces the coherence time of the quantum state of the Cooper-pair box 10, on the one hand, and scrambles any measurement of the charge of this state by an electrometer, on the other.

The electrometer may be replaced with another measurement circuit, as indicated in the document "Coherent control of macroscopic quantum states in a single Cooper-pair box" by Nakamura and al. from the company NEC, Nature, Vol.

398 of Apr. 29, 1999. A schematic representation of this circuit is reproduced in FIG. 2 of the present application. The island 10 of the Cooper-pair box is bounded by two Josephson junctions 1 and 2, a capacitor 3 connected to the adjustable DC bias voltage source 21 of the voltage $V_g$ and by a capacitor 4 connected to a source of radiofrequency pulses of voltage $V_p$ at the transition frequency of the island. The island is also bounded by a third Josephson junction 5, of very small dimensions and constituting only the coupling to a voltage source 23 delivering a voltage $V_b$ and an ammeter (not shown) which are intended to read the state of the qubit. Although this read Josephson junction 5 has a resistance a few hundred times higher than the resistance of the other Josephson junctions, the permanent observation that it has on the qubit leads to its rapid loss of coherence. This read method, which is less sensitive to charge noise, increases the decoherence of the qubit to the point of making its operation hypothetical. The coherence time obtained, limited by the charge noise and the permanent reading, is a few nanoseconds.

It may be noticed that in both the above reading methods the same degree of freedom—the electrical charge—is used for writing and for reading the qubit.

Briefly, it may be stated that the Cooper-pair box, like any circuit which bases its quantum behaviour on a single degree of freedom in terms of charge, is either affected by an excessive charge noise or affected by the coherence time being much too short.

Since this charge noise is due to an electrostatic environment extremely difficult to control, researchers at the Delft University of Technology (TU-Delft) in the Netherlands has strived to produce a qubit whose degrees of freedom are phases. The principal degree of freedom creates permanent currents within a superconducting loop. This work is reported in the two documents mentioned below.

The first TU-Delft document, "Josephson persistent-current qubit" by J. E. Mooij, C. van der Wal et al., pp. 1037–1039, Science, Vol. 285 of Aug. 13, 1999 is above all a proposal. Described therein is an actual qubit consisting of three Josephson junctions connected in series in a superconducting loop, crossed by an adjustable magnetic flux. Two of these Josephson junctions have the same Josephson energy $E_J$ and the third has a lower Josephson energy, preferably $0.75 E_J$.

These three Josephson junctions are furthermore constructed in such a way that the ratio of their Josephson energy $E_J$ to their Coulomb energy $E_C$ is around 80.

The two fundamental quantum states give rise in the superconducting loop to currents flowing in opposite directions, $i_0$ and $i_1$. In a first embodiment described in that document, writing is accomplished by radiofrequency current pulses sent into a control conductor located near the superconducting loop. It is shown schematically by a straight wire magnetically coupled to the loop and produced on a different level in relation to the substrate.

The second TU-Delft document, "Quantum superposition of macroscopic persistent-current states" by C. van der Wal, J. E. Mooij et al., pp 773–776, Science, Vol. 290 of Oct. 27, 2000, describes the production of one of the qubits proposed in the previous document (superconducting loop based on three Josephson junctions). FIG. 1A of that document shows schematically an actual quantum bit limited to three super-conducting Josephson junctions. It is reproduced in FIG. 3 of the present application, in which the three Josephson junctions are labelled 51, 52 and 53.

The write circuit, not shown in the diagram, is a single wire in which a current pulse is sent for writing operations, as in the proposal of the aforementioned first TU-Delft document. The read circuit relies on a SQUID magnetically coupled to the qubit and consisting of Josephson junctions 54 and 55. Such a qubit has a coherence time of 15 ns, too short to be manipulable, and the read efficiency is very low (signal-to-noise ratio S/N <0.1). Moreover, it may be noted that it is the same physical quantity which is involved in writing and reading the qubit.

Document WO 01/50534, having the title "Qubit using a Josephson junction between S-wave and D-wave superconductors" describes a theoretical proposal for a Josephson qubit based on a Cooper-pair box, one of the electrodes of the Josephson junction being a non-BCS superconductor with a D-type wavefunction symmetry, the other being a conventional superconductor with an S-type symmetry. The choice of these two types of superconductor having different, S and D, symmetries is essential to the operation of this circuit, since the method of reading relies on the existence of magnetic moments in such an SD junction. Such a device can in no case operate without the D-type superconductor. Since these superconductors are ceramics, the SD junctions are very tricky to implement. Reading is based on the use of single-electron transistors.

The document WO 02/15290 "Shaped Josephson junction qubits" describes a theoretical proposal for a Josephson qubit and the preliminary results of an embodiment. The qubit described is based on the phase states of a long ring-shaped Josephson junction in which the phase undergoes a rotation of $2\pi$ over one flux quantum in the loop. The two quantum levels of the qubit have not been observed and the coherence time has therefore not been able to be determined.

Thus, existing superconducting qubits based on Josephson junctions, whether their principal degrees of freedom are only charges or only phases $\delta$, do not achieve a coherence time long enough to allow their state to be reliably read. Moreover, they have one characteristic in common, namely they have recourse to the same physical quantity both for modifying the state of the qubit (writing) and to measure it (reading).

SUMMARY OF THE INVENTION

One objective of the qubit according to the invention is to avoid the drawbacks of the prior art, especially the shortness of the coherence time and the low reproducibility (fidelity) in reading. Another objective of the invention is to make it easier to couple several qubits, preferably on a single substrate.

These objectives are achieved according to the invention thanks to a superconducting quantum-bit device based on Josephson junction, characterized in that it has a first principal degree of freedom assigned to writing and a second principal degree of freedom assigned to reading and in that one of the first and second principal degrees of freedom is due to a charge while the other of the first and second principal degrees of freedom is due to a phase.

Preferably, the first principal degree of freedom assigned to writing is a charge and the second principal degree of freedom assigned to reading is a phase.

According to a preferred embodiment, the qubit according to the invention comprises:

a Cooper-pair box comprising first and second Josephson junctions defining a charge island of the Cooper-pair box closing up onto a superconducting loop in order to form a qubit;

a write circuit comprising a gate electrode placed facing the said Cooper-pair box and constituting with it a capacitor of capacitance $C_g$, the gate electrode capacitively coupled to the charge island, allowing this qubit to be placed in one or other of the two base states of the qubit or in a coherent superposition of these states, a bias voltage $V_g$ being applied to the gate electrode from an adjustable voltage source; and a read circuit comprising a read Josephson junction inserted into the said superconducting loop and having a Josephson energy of at least 50 times greater than the Josephson energy of each of the first and second Josephson junctions.

The first and second Josephson junctions defining the charge island have, on the one hand, very similar Josephson energies $E_J$ and, on the other hand, a Coulomb energy $E_C$ approximately equal to their Josephson energy $E_J$.

The Josephson junctions defining the charge island have a ratio, $E_J/E_C$, of their Josephson energy $E_J$ to their Coulomb energy $E_C$ which is between 1 and 3.

The superconducting loop is constructed in such a way that the transition frequency $v_{01}$ of the qubit thus formed can be adjusted to a value which is stationary with regard to external parameters and perturbations.

The device according to the invention includes means capable of inducing a tunable magnetic flux through the superconducting loop, by acting on the phase $\delta$ of the qubit.

The read out Josephson junction has an effective $E_J/E_C$ ratio, taking into account the capacitance added by the read circuit, high enough for the fluctuations in its phase which are induced by the external circuit to be less than 0.01 rd.

According to a preferred embodiment, the device includes a read circuit, independent of the write circuit, galvanically connected to the said superconducting loop of the qubit and having, apart from the read Josephson junction, on the one hand, means for applying, during the reading phase, a current pulse Ib of parameterizable duration and amplitude and, on the other hand, means for detecting the $2\pi$ phase jumps at the terminals of the read Josephson junction which appear, as a result of the read out pulse, exclusively for one of the two states.

Advantageously, the device is preset by its parameters namely the bias charge $N_g$ and the superconducting phase difference $\delta$ due to the magnetic flux $\Phi_j$ threading the superconducting loop and to the read out current $I_b$, at an operating point $F_i$ where the transition frequency $v_{01}$ of the qubit is stationary with respect to the two setting parameters $N_g$ and $\delta$.

Preferably, the operating point $F_i$ of the device is the point $F_1$ constituting a saddle point on the three-dimensional graph representing the eigenfrequency $v_{01}$ of the qubit as a function of $N_g$ and $\delta$.

Out of the reading sequences producing read out pulses having a peak value $I_{bc}$, the means for applying a current pulse deliver a quiescent current of about $-0.25I_{bc}$, which is negative with respect to the direction of the read out pulses, making it possible, when a reading pulse arrives, to displace the superconducting phase difference $\delta$ by between $\pi/2$ and $\pi$.

BRIEF DESCRIPTION OF THE DRAWINGS

Further features and advantages of the invention will become apparent from the following description of particular embodiments, given by way of examples, with reference to the appended drawings in which.

DETAILED PRESENTATION OF PARTICULAR EMBODIMENTS OF THE INVENTION

A superconducting quantum-bit (or qubit) device according to the invention makes it possible to increase the coherence time over that of the devices of the prior art and to increase the reading reproducibility. To do this, two principal degrees of freedom are used simultaneously, namely a charge and a phase $\delta$.

Figure 1:
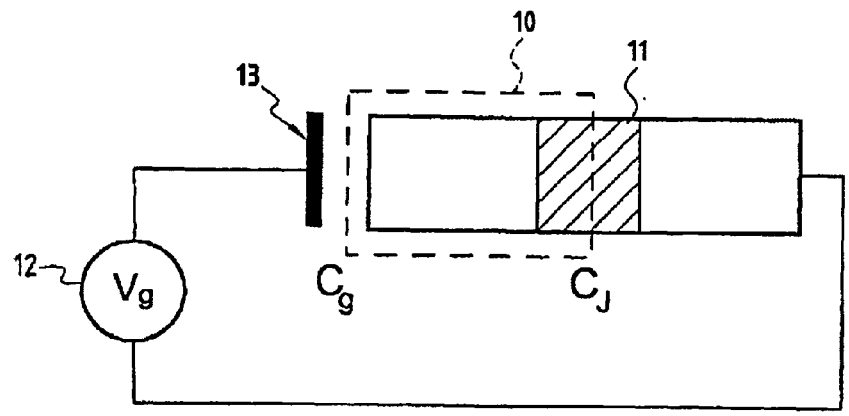
FIGS. 1 to 3 show schematically examples of circuits according to the prior art.
Figure 2:
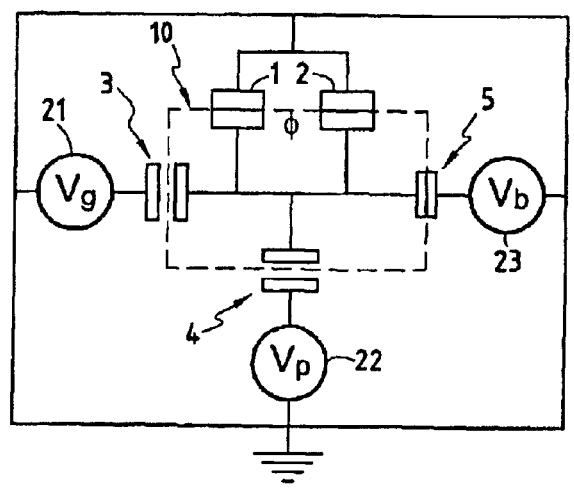
Figure 3:
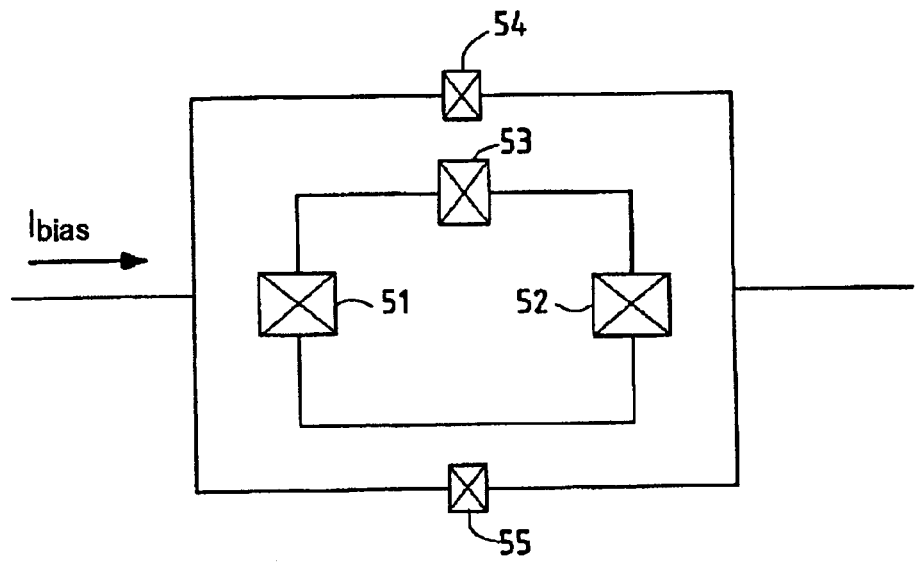
Figure 4:
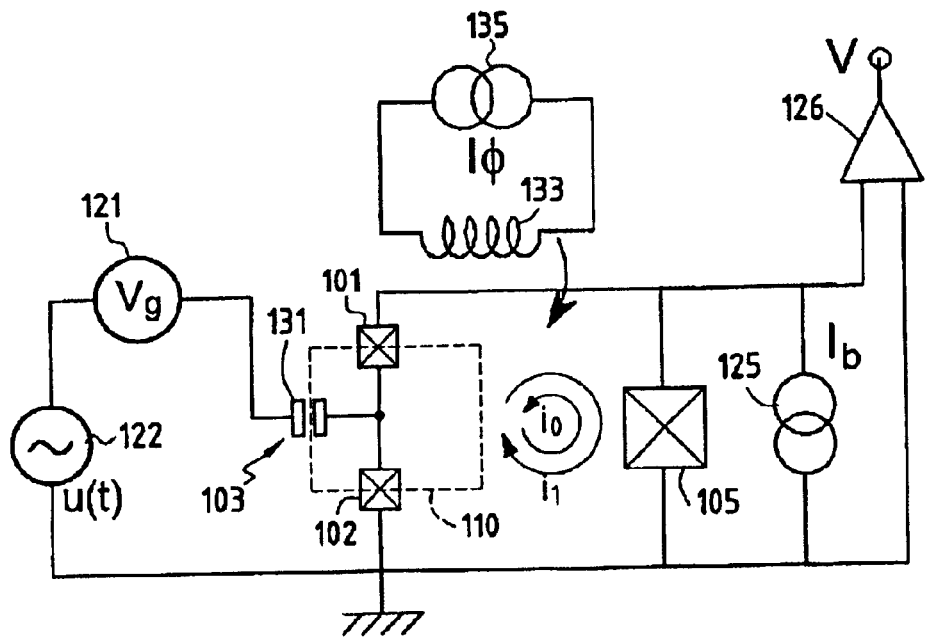
FIG. 4 is a block diagram illustrating the main features of a superconducting quantum-bit device according to the invention.

The device according to the invention will be described more particularly with the aid of the diagram in FIG. 4.

The charge principal degree of freedom is that of a Cooper-pair box 110, the ratio of the Josephson energy $E_J$ to the Coulomb energy $E_C$ of the effective junction corresponding to the stake in parallel of the two junctions 101, 102 of which is between 1 and 12 and preferably between 5 and 12. Its charge nature is exploited in order to manipulate the quantum bit by applying voltages to the gate electrode 131 of the box 110. The principal degree of freedom in the nature of a phase $\delta$ is characterized by the ratio of the Josephson energy $E_J$ to the Coulomb energy $E_C$ of a third Josephson junction 105, which is included in an S-type superconducting loop closing up onto the Cooper-pair box 110 and constituting the detecting element of the read circuit: this ratio is greater than 5000. Writing is performed, on the one hand, by varying the charge degree of freedom by applying, to the gate electrode 131 of the box 110 (coupling via the capacitor 103 of capacitance $C_g$), a DC voltage $V_g$ from a voltage source 121 in order to reach the optimum operating point $N_g = 1/2$, where $N_g$ represents the reduced bias charge of the island ($C_g V_g/2e$) and, on the other hand, by applying, from a source 122, radiofrequency pulses u(t) at or close to resonance, with the qubit of the box 110. In reading, a current pulse $I_b$ from a current source 125 is applied to the read out junction 105 in order to bring it close to its critical current. The state of the quantum bit is determined by detecting the presence or absence of one or more $2\pi$ phase jumps in the case of the read junction 105. When these phase jumps form an uninterrupted avalanche, reading is achieved by measuring the voltage V at the terminals of the read junction 105 using an amplifier circuit 126. The two states of the qubit correspond faithfully to the appearance or absence of a finite voltage. When the qubit is in write mode or else in hold/computing mode, this read junction 105 behaves like a short circuit because of its Josephson energy $E_J$ being of the order of 50 to 100 times greater than the Josephson energy of each of the other two junctions 101, 102.

It is also possible to define the qubit according to the invention in that it is based on a device having two quantum degrees of freedom with which two physical quantities of different nature are associated, namely:

- a variation in voltage (or charge) on a gate electrode which allows a coherent superposition a $|0>+b\ |1>$ of the two quantum states of the qubit to be written;
- a phase difference or current in a loop of S-type superconducting material such as, for example, superconductors based on aluminium or niobium, the measurement of which phase or current allows the state of the qubit to be read.

This device can be placed under conditions which maximize the coherence time. This independence of the two ports is an advantage essential for decoupling writing from reading.

This superconducting qubit circuit according to the invention may also be defined in that:

a) it includes a superconducting island between two Josephson junctions 101, 102 of comparable Josephson energies $E_{J1}$ and $E_{J2}$, these junctions being within an S-type superconducting loop, the loop being constructed in such a way that the transition frequency of the qubit can be electrically adjusted to a stationary value with respect to external parameters and perturbations;

b) it includes an electrode 131 capacitively coupled to the superconducting island, that the configuration of the circuit allows to tune the transition frequency between the two states of the qubit, this electrode being moreover capable, during write phases, to place the qubit in a coherent superposition of the two states of the qubit;

c) it includes means 133, 135 for applying a magnetic flux $\phi$ to the superconducting loop, that the configuration of the circuit allows to tune the transition frequency $v_{01}$ between the two states of the qubit;

d) it includes a third Josephson junction 105 referred to as the $J_L$ read out Josephson junction, the Josephson energy $E_{JL}$ of which is about 50 to 100 times, and preferably approximately 80 times, greater than the Josephson energy $E_{J1}$ or $E_{J2}$ of the Josephson junctions 101, 102 defined above, this read Josephson junction 105 then operating as a superconducting short circuit during writing or holding phases, and operating as a threshold detector during the reading phase; and e) it includes a read circuit, independent of the write circuit, galvanically connected to the superconducting loop of the qubit and having, apart from the read Josephson junction 105, on the one hand, means 125 for applying a current pulse $I_b$ of adjustable duration and amplitude during the read step and, on the other hand, means 126 for detecting the phase jumps at the terminals of the read Josephson junction 105 owing to the conjugate effect of the state of the qubit and of the read pulse.

Moreover, the entire electrical circuit is designed in such a way that its structure and its operation are as symmetrical as possible. In addition, the qubit is able to be placed under operating conditions conducive to maintaining its coherence.

These operating conditions conducive to maintaining the coherence of the qubit forming the subject of the invention are:

1) prior to its use and during manipulation of the quantum state, the electrical adjustment of the transition frequency of the two quantum states to a stationary value with respect to the DC voltage $V_g$ applied to the capacitor 103 of capacitance $C_g$ on the electrode of 103 not belonging to the charge island, and with respect to the magnetic flux crossing the qubit;

2) during the write phases (manipulation of the quantum state) cancellation of all of the currents flowing in the loop of the actual qubit, by a particular combination of a magnetic flux and of a current in the read junction 105; and 3) the read circuit is not permanently activated, but only at certain instants determined by read pulses $I_b$.

The charge island may, through the capacitor 103 of capacitance $C_g$ to which it is connected, be charge biased.

This is achieved by applying, to the electrode 131 of the capacitor 103 not forming part of the island, a superposition:

- of a DC bias voltage $V_g$ which in practice determines the resonant frequency of the loop that the qubit constitutes; and
- of a sequence of voltage oscillations u(t) at or close to this resonant frequency, their amplitude and their number allowing the qubit to be placed in a coherent superposition $a|0>+b|1>$ of its two quantum states.

The Josephson junctions 101, 102 defining the charge island are chosen in such a way that their Josephson energies $E_J$ are close to their Coulomb energies $E_C$. Each of these junctions has an electrode which forms part of the superconducting island and an electrode which does not form part of it. Between the electrodes of each of these junctions which do not belong to the island, the phase difference $\delta$ imposed by the read current pulse makes currents flow in the loop of the qubit which depend on its state.

These two Josephson junctions 101, 102 are chosen in such a way that their energies $E_J$ are similar to their energies $E_C$, which is generally achieved in the case of small junctions. Furthermore, the Josephson energies $E_J$ of the junctions 101, 102 have values as close as possible. The electrodes of the Josephson junctions not belonging to the island are joined together to form a superconducting loop, the whole assembly forming the actual qubit. In reality, this loop also includes the third Josephson junction 105, but which has much larger dimensions so that its Josephson energy $E_J$ is very high compared with the Coulomb energy $E_C$.

It is this feature which allows the read junction to behave, out of the reading periods, as a superconducting short circuit.

Adjusting the Operating Point of the Qubit

Figure 5:
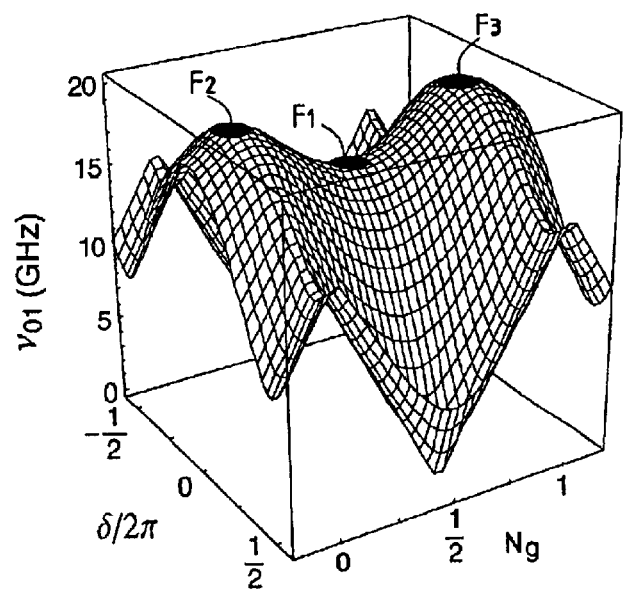
FIG. 5 is a diagram in three dimensions illustrating the choice of the operating point of a quantum-bit device according to the invention.

The transition frequency of the qubit depends on the external parameters, these being the charge coupled to the island and the magnetic flux through the loop. Electrical-charge or magnetic-charge noise is therefore liable to cause this transition frequency to vary during manipulation of the qubit, and therefore to induce a random phase shift responsible for the decoherence of its quantum state. The sensitivity to this noise is therefore minimal at the operating points $F_1$, $F_2$ and $F_3$, where the transition frequency $v_{01}$ is stationary with respect to external parameters. These operating points are therefore preferential points. For a qubit according to the invention, the possible points are the saddle point, denoted $F_1$ in FIG. 5 ($N_g=0.5$ modulo 1, and $\delta=0$ modulo $2\pi$) and the peak point $F_2$ or $F_3$ to within $2\pi$ ($N_g=0$ or 1 and $\delta=0$ modulo $2\pi$) on the three-dimensional graph.

Recording a State or a Coherent Superposition of the States

The amplitude of the alternating voltage u(t) corresponds to a coupled charge of the order of 0.01 times 2e.

Reading the State of the Qubit

To read the state of the qubit, a current generator 125 in parallel with the read Josephson junction 105 generates a pulse $I_b$ (FIG. 8) whose intensity and duration (typically 100 ns) are adjustable. During a pulse, this current generator 125 induces a superconducting phase difference $\gamma$ at the terminals of the read Josephson junction 105, which phase difference, together with the superconducting phase difference δ at the terminals of the Cooper-pair box 100 and with the magnetic flux φ crossing the loop, satisfies the following equation:

δ=γ+(φ/φ$_0$) 2π, in absolute value and modulo 2π where φ$_0$ is the quantum of magnetic flux.

At the operating point F$_i$ (N$_g$=0.5 modulo 1, and δ=0 modulo 2π) at the time of the read pulse, the phase γ undergoes a displacement which induces a displacement in the phase δ. The read junction 105 switches around γ=π/2.

During reading, the current must be close to the critical current of the read junction 105 so as to be able to have transition rates close to 0% and 100% for the two states of the qubit, respectively. The bias current I$_b$ outside the reading phase is chosen so as to hold the circuit at the chosen point F, such as the points F$_1$, F$_2$ and F$_3$ in FIG. 5. Finally, the choice of the flux φ coupled to the superconducting loop may be optimized so that the loop currents i$_0$ and i$_1$ associated with the states I0> and I1>, ascertained by the read pulse, are as different as possible.

Optimizing the Reading of the State of the Qubit

Reading the state of the qubit according to the invention is optimized by choosing the magnetic flux φ induced through the superconducting loop so that the loop currents i$_0$ and i$_1$ associated with the |0> and |1> states, ascertained by the read pulse, are as different as possible. To compensate for this magnetic flux and to keep the phase δ in the zero value corresponding to the operating point F$_i$, the read current generator delivers, outside the read sequences, not a zero quiescent current but a quiescent current of about −0.25I$_{bc}$, this being negative with respect to the direction of the read pulses. The peak value I$_{bc}$ of these pulses remains unchanged. According to this preferential optimization, the displacement in phase δ during the read pulse will be between π/2 and π.

Decoupling the Qubit from the Read Junction

The read loop has eigenmodes whose frequency must be as far away as possible from the eigenfrequency of the actual qubit so as to prevent the qubit from relaxing towards its fundamental ground state I0>.

This separation between the eigenfrequencies of the qubit and of the read junction already exists because of the large difference between the dimensions and the characteristics of the read Josephson junction 105 and those of the Josephson junctions 101, 102 defining the island. It is intentionally increased by adding one or more capacitors 136 (FIG. 7) to the terminals of the read Josephson junction 105.

Maintaining the Coherence

Figure 7:
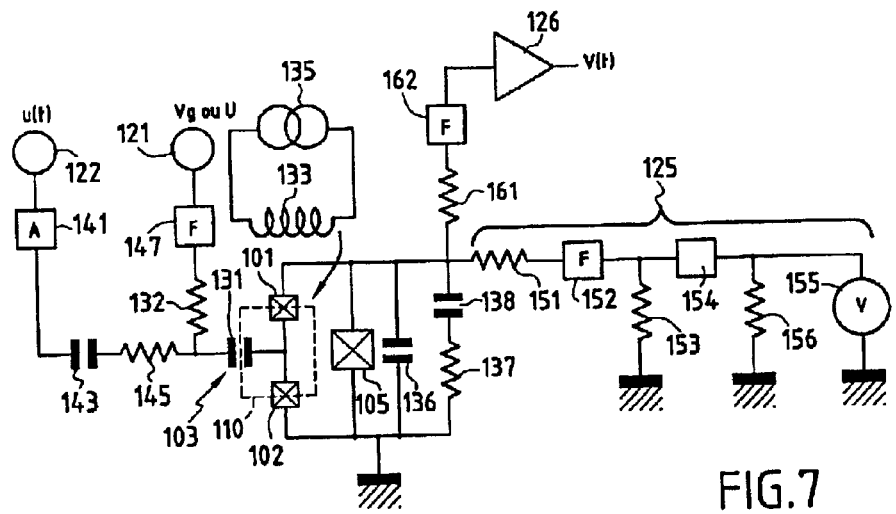
FIG. 7 is a diagram illustrating one particular embodiment of a superconducting quantum-bit device according to the invention.

The coherence of the qubit is maintained by satisfying three conditions:

a) the first condition aims to eliminate the effect of charge noise seen by the island. Contrary to the Cooper-pair box measured in charge mode, it is possible according to the invention to choose the ratio of the Josephson energy parameter E$_J$ to the Coulomb energy parameter E$_C$ so as simultaneously to be able:

to ensure an harmonicity of the spectrum of energies in order to form an effective qubit, to make the transition frequency almost completely insensitive to the charge noise and to manipulate the state of the qubit by applying radiofrequency voltages to the gate 131 of the island;

b) the second condition aims to limit the relaxation of the qubit, which relaxation contributes to decoherence, when the qubit is placed in its excited state conventionally denoted by I1>. This is because a qubit can be de-excited by transferring its energy to its immediate environment, in this case here into the entire electrical circuit. More specifically, this transfer is effected towards the real part 137 of the equivalent electrical impedance 137, 138 as seen by the qubit (FIG. 7). This impedance, even when minimized, cannot strictly be zero. In order for the energy transfer to be zero, it is therefore necessary to impose the condition that no current flow in the superconducting loop of the qubit. This condition for there to be no current in the loop of the circuit is obtained by precisely cancelling the phase at the terminals of the series combination of the two Josephson junctions of the Cooper-pair box, by means of an appropriate combination of a current in the measurement Josephson junction and of a magnetic flux through the superconducting loop of the qubit, this flux being applied either by a suitable permanent magnet or by an induction coil crossed by a control current. This condition must be met during the write and hold phases, whatever the state of the qubit, and therefore whatever the flux to be cancelled;

c) the third condition aims to limit the influence of the environmental parameters on decoherence. Let us denote by IΨ(t=0)> the following superposed state:

$$IΨ(t=0)>=I0>+I1>.$$

Ideally, this state evolves freely by relative phase shift of the components I0> and I1> at the transition frequency ν$_{01}$ of the qubit:

$$IΨ(t)>=I0>+\exp(2i\pi ν_{01}t)I1>.$$

If the transition frequency ν$_{01}$ depends on external parameters, which may be represented by the generic variable x, any noise on this generic variable x is manifested by a fluctuation in the transition frequency ν$_{01}$ and therefore by a random error in the relative phase shift of the components I0> and I1>: this is the phenomenon of decoherence. Decoherence is therefore a minimum when the transition frequency ν$_{01}$ is stationary with respect to x, that is to say when the following condition is fulfilled:

$$dν_{01}/dx=0.$$

For the invention, the external parameters on which the transition frequency ν$_{01}$ depends, and which have been indicated symbolically by the generic variable x, are essentially two in number, namely the DC voltage V$_g$ applied to the capacitor 103 and the magnetic flux φ through the superconducting loop constituting the actual qubit. The values of V$_g$ and φ are therefore adjusted so that the following two conditions are simultaneously satisfied:

$$dν_{01}/dV_g=0$$

$$dν_{01}/dφ=0$$

which minimizes the decoherence, especially in the case of a superposed state of the qubit.

Figure 10:
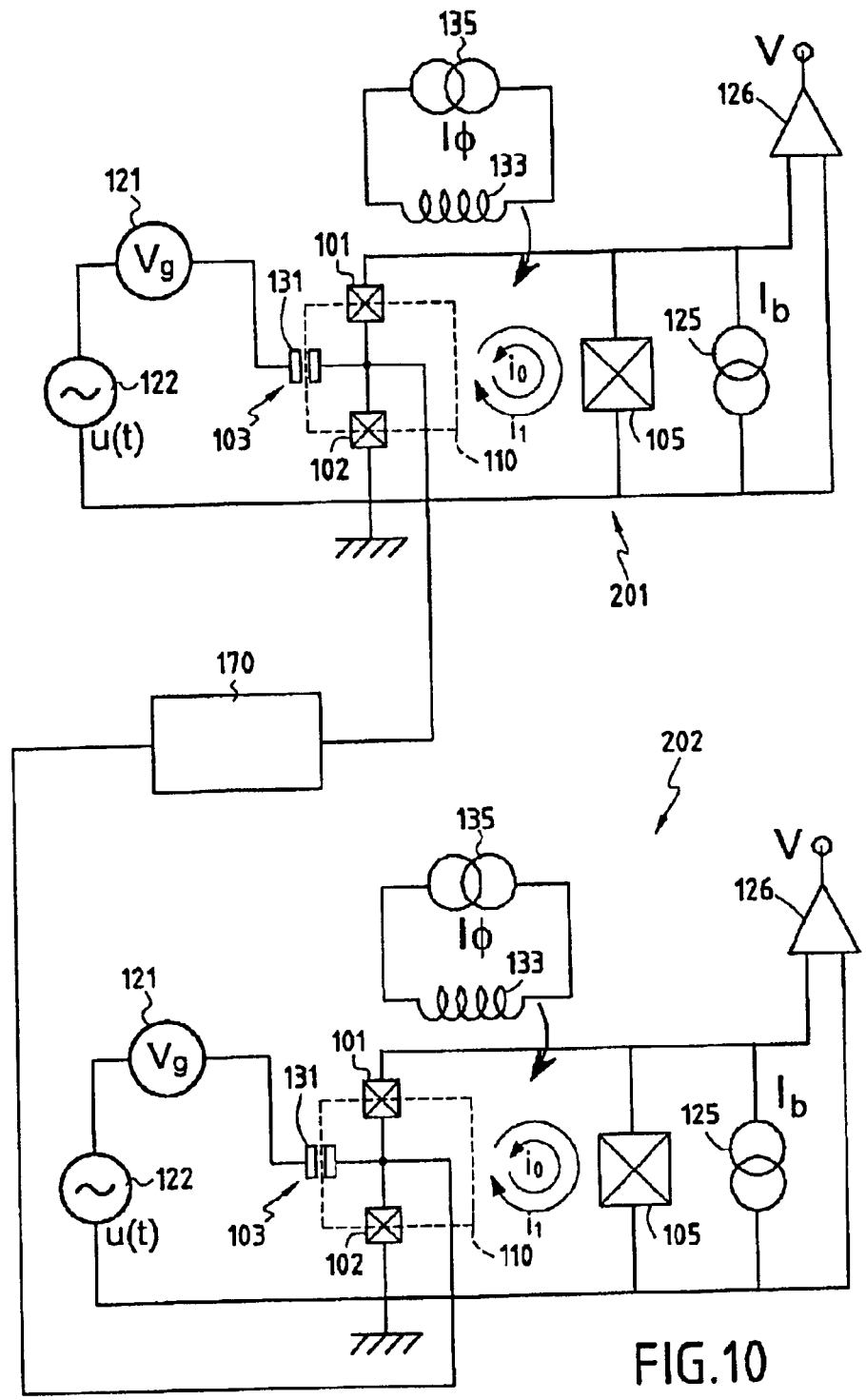
FIG. 10 is a diagram illustrating an example of the coupling of two examples of superconducting quantum-bit devices according to the invention.

Finally, the qubit forming the subject of the invention may be coupled to one or more other qubits also possessing an island. This is obtained by adding, between their respective islands, an electromagnetic coupling device 170 which does not significantly modify the value of the effective E$_J$/E$_C$ ratio of each of the circuits 201, 202 constituting the qubits (FIG. 10). Preferably, this coupling device is a capacitor connecting the islands of the two successive qubits 201, 202.

The operation of an example of the device according to the invention will be explained with the aid of the block diagram in FIG. 4.

The charge island is bounded by the insulation of the Josephson junctions 101 and 102. These junctions 101 and 102 have very similar characteristics. Their surface has very small dimensions (approximately 0.1 µm by 0.1 µm) and they are designed so that the $E_J/E_C$ ratio of each is between 1 and 3. The value of this ratio $E_J/E_C$ for the effective junction of the Cooper-pair box 110, which is four times higher, is therefore between 4 and 12.

The superconducting loop is closed up by a read junction 105 having much greater dimensions (approximately 3 µm by 0.3 µm), behaving for the qubit virtually as a short circuit outside the measurement steps. This is because its Josephson energy $E_J$ is approximately 100 times larger than the Josephson energy of the junctions 101 and 102. Moreover, the ratio $E_J/E_C$ of this read junction 105 is approximately 5000 to 10000 times higher than the ratio $E_J/E_C$ of the junctions 101 and 102.

This loop is subjected to an adjustable magnetic flux $\phi$ induced either by a permanent magnet or by a coil 103 or an electrical wire threaded by a current coming from a current source 135 flows, these being placed near, and possibly on, the same substrate as the qubit. This flux $\phi$ allows the $\delta$ coordinate of the operating point to be adjusted during manipulation of the qubit. In particular, it allows compensation of a negative quiescent current in the read junction 105, while keeping the phase $\delta$ at the preferred value.

Figure 6:
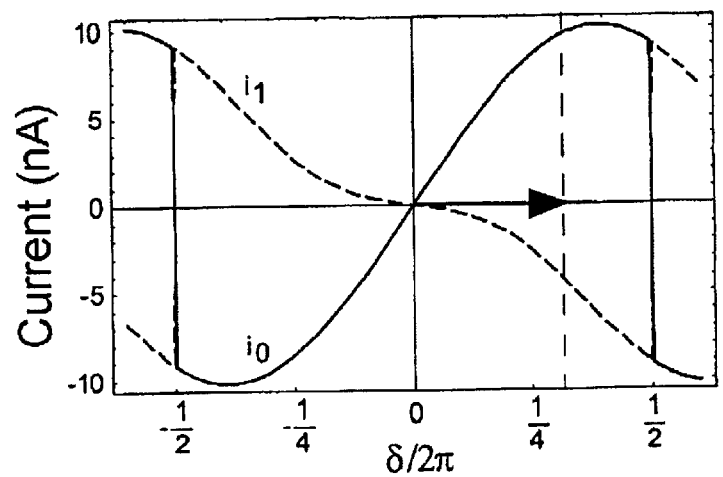
FIG. 6 is a diagram illustrating the adiabatic displacement of the state of the system of a quantum-bit device according to the invention, during a measurement pulse.

This combination of magnetic flux through the loop and of negative quiescent current in the measurement junction 105 makes it possible to increase the discriminatability of the 0 and 1 states during reading: this is because the amplitude of the current $I_b$ used for the reading must then be increased in order to result in switching of the read junction. This amplitude increase results in a displacement of the phase during reading (see FIG. 6) towards values in which the difference in the loop currents $i_1-i_0$ is greater than what it would be in a case of a zero magnetic flux and a zero quiescent current.

One particular embodiment of the device according to the invention will now be described with reference to the FIG. 7.

This circuit can be made with any S-type superconducting material such as, for example, aluminium or niobium. The preferred embodiment is on an $Si/SiO_2$ substrate by vacuum deposition of conducting films of aluminium.

The Josephson junctions 101 and 102 are formed by two aluminium ribbons deposited along the same axis but separated by a few nanometres. These ribbons are oxidized into $Al_2O_3$. A short third ribbon is then deposited in the gap between the first two ribbons in such a way that this ribbon overlaps the first two by two areas each approximately 0.1 µm×0.1 µm, thereby constituting the two Josephson junctions 101, 102. This third ribbon constitutes the island of the Cooper-pair box and therefore also the first plate 131 of the capacitor 103 of capacitance $C_g$. Formed parallel to this new ribbon is another ribbon which will constitute the second plate of the capacitor 103.

The dimensions of the charge island thus formed are small.

The rest of the loop of the actual qubit is produced in a similar manner, but the surface of the read Josephson junction 105 is greater, approximately 1 $\mu M^2$.

The operating temperature of the circuit must be well below the transition energy of the qubit divided by the Boltzmann constant kB. In practice, this temperature is about 50 mK and is obtained with an $He_3/He_4$ dilution refrigerator.

FIG. 7 corresponds to a preferred embodiment.

The bias voltage source $V_g$ of the Cooper-pair box 110 is connected, via the low-pass filter 147 and then the resistor 132 ensuring impedance matching to a 50 ohm coaxial line, to the control gate 131 of the Cooper-pair box 110.

Similarly, the radiofrequency source 122 is connected, via an attenuator 141, a capacitor 143 and a resistor for impedance matching to a 50 ohm coaxial line, to the control gate 131.

The superconducting loop, formed from the Josephson junctions 101 and 102 and the read Josephson junction 105, is filtered by a capacitor 136 which also allows the frequency of the read loop to be significantly far from the frequency of the qubit.

The resistor 137 and the capacitor 138 model respectively the real and the imaginary parts of the impedance of the circuit seen by the qubit.

The magnetic flux $\phi$ is adjusted by a variable current source 135 connected to quite a wide induction coil 133 in order to apply a uniform flux through the entire qubit.

The read current source 125 is in fact formed by a voltage source 155 delivering a voltage V, a resistive divider 154 dividing by a factor of 200, a low-pass filter 152 and a series resistor 151 of the order of 3 kilohms. The resistors 153 and 156, both 50 ohms, serve both to allow the resistive divider 154 to operate and to match the line to a 50 ohm impedance.

Finally, the switching of the read Josephson junction 105 is detected through the resistor 161 which increases the impedance of the circuit located downstream. This circuit includes a low-pass filter 162 and then an amplifier 126 having a high input impedance.

Figure 8:
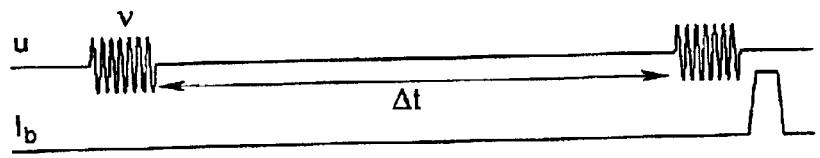
FIG. 8 shows examples of signal timing diagrams involving the manipulation or measurement of quantum states of a quantum-bit device according to the invention.

FIG. 8 shows, in its upper part, the timing diagram for the write signal u(t) consisting of bursts of pulses having a frequency equal or close to $v_{01}$, the duration of which depends on the quantum state to be recorded, and then, in its lower part, the timing diagram for the read current pulses $I_b$.

Figure 9:
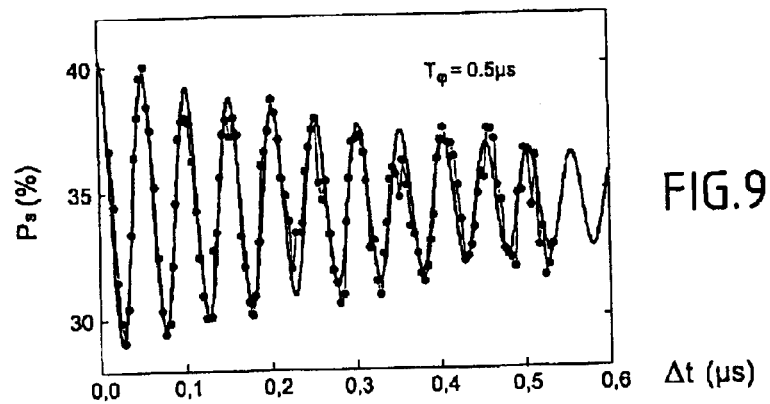
FIG. 9 is a diagram representing the Ramsey interference of the quantum-bit device according to the invention, which shows its coherence time.

Finally, FIG. 9 shows the probability $P_s$ of finding the quantum bit in the |1> state after a sequence of two rotations separated by a variable time interval.

What is claimed is:

1. A superconducting quantum-bit based on Josephson junctions, characterized in that it has a first principal degree of freedom assigned to writing and a second principal degree of freedom assigned to reading, and in that one of the first and second principal degrees of freedom is due to a charge while the other of the first and second principal degrees of freedom is due to a phase.

2. The superconducting quantum-bit according to claim 1, characterized in that the first principal degree of freedom assigned to writing is a charge and in that a second principal degree of freedom assigned to reading is a phase.

3. A superconducting quantum-bit based on Josephson junctions, characterized in that it has a first principal degree of freedom assigned to writing and a second principal degree of freedom assigned to reading, in that one of the first and second principal degrees of freedom is due to a charge while the other of the first and second principal degrees of freedom is due to a phase, and in that it comprises:

a Cooper-pair box comprising first and second Josephson junctions defining a charge island of the Cooper-pair box closing up onto a superconducting loop in order to form a qubit;

a write circuit comprising a gate electrode placed facing the said Cooper-pair box island and constituting with it a capacitor of capacitance $C_g$, the gate electrode capacitively coupled to the charge island, allowing this qubit to be placed in one or other of the two base states of the qubit or in a coherent superposition of these states, a bias voltage $V_g$ being applied to the gate electrode from an adjustable voltage source; and a read circuit comprising a read Josephson junction $J_L$ inserted into the said superconducting loop and having a Josephson energy at least 50 times greater than the Josephson energy of each of the first and second Josephson junctions.

4. The superconducting quantum-bit according to claim 3, characterized in that the first and second Josephson junctions defining the charge island have, on the one hand, very similar Josephson energies $E_j$ and, on the other hand, a Coulomb energy $E_C$ approximately equal to their Josephson energy $E_J$.

5. The superconducting quantum-bit according to claim 3, characterized in that the Josephson junctions defining the charge island have a ratio, $E_J/E_C$, of their Josephson energy $E_J$ to their Coulomb energy $E_C$ which is between 1 and 3.

6. The superconducting quantum-bit according to claim 3, characterized in that the superconducting loop is constructed in such a way that the transition frequency $v_{01}$ of the qubit thus formed can be adjusted to a value which is stationary with respect to external parameters and perturbations.

7. The superconducting quantum-bit according to claim 3, characterized in that it includes means capable of inducing an adjustable magnetic flux pass through the superconducting loop, by acting on the phase $\delta$ of the qubit.

8. The superconducting quantum-bit according to claim 3, characterized in that the read Josephson junction has an effective $E_J/E_C$ ratio, taking into account the capacitance added by the read circuit, high enough for the fluctuations in its phase which are induced by the external circuit to be less than 0.01 rd.

9. The superconducting quantum-bit according to claim 3, characterized in that it includes a read circuit, independently of the write circuit, galvanically connected to the said superconducting loop of the qubit and having, apart from the read Josephson junction, on the one hand, means for applying, during the read phase, a current pulse $I_b$ of parameterizable duration and amplitude and, on the other hand, means for detecting the $2\pi$ phase jumps at the terminals of the read Josephson junction which appear, as a result of the read pulse, exclusively for one of the two states.

10. The superconducting quantum-bit according to claim 7, characterized in that it is preset by its parameters namely the bias charge $N_g$ and the superconducting phase difference $\delta$ due to the magnetic flux $\Phi_j$ flowing through the superconducting loop and to the read current $I_b$, at an operating point $F_i$ where the transition frequency $v_{01}$ of the qubit is stationary with respect to the two setting parameters $N_g$ and $\delta$.

11. The superconducting quantum-bit according to claim 10, characterized in that its operating point $F_i$ of the device is the point $F_2$ constituting a saddle point on the three-dimensional graph representing the eigenfrequency $v_{01}$ of the qubit as a function of $N_g$ and $\delta$.

12. The superconducting quantum-bit according to claim 10, characterized in that it includes a read circuit, independently of the write circuit, galvanically connected to the said superconducting loop of the qubit and having, apart from the read Josephson junction, on the one hand, means for applying, during the read phase, a current pulse $I_b$ of parameterizable duration and amplitude and, on the other hand, means for detecting the $2\pi$ phase jumps at the terminals of the read Josephson junction which appear, as a result of the read pulse, exclusively for one of the two states.

13. The superconducting quantum-bit according to claim 12, characterized in that out of the reading sequences producing read pulses having a peak value $I_{bc}$, the means for applying a current pulse deliver a quiescent current which is negative with respect to the direction of the read pulses with an absolute value which is less than the peak value $I_{bc}$, making it possible, when a read pulse arrives, to displace the superconducting phase difference $\delta$ by between $\pi/2$ and $\pi$.

14. A multiple quantum-bit device, characterized in that it comprises at least a first superconducting quantum-bit having a first principal degree of freedom due to a charge which is assigned to writing and a second principal degree of freedom due to a phase which is assigned to reading, at least a second superconducting quantum-bit having a first principal degree of freedom due to a charge which is assigned to writing and a second principal degree of freedom due to a phase which is assigned to reading, and a coupling device coupling both said first principal degrees of freedom due to charges of said first and second superconducting quantum-bits.

15. The multiple quantum-bit device according to claim 14, characterized in that said coupling device comprises at least one capacitor.

* * * * *

UNITED STATES PATENT AND TRADEMARK OFFICE
CERTIFICATE OF CORRECTION

PATENT NO.        : 6,838,694 B2
APPLICATION NO. : 10/244634
DATED             : January 4, 2005
INVENTOR(S)       : Daniel Esteve et al.

It is certified that error appears in the above-identified patent and that said Letters Patent is hereby corrected as shown below:

Column 5, line 35, "Ib" should read --$I_b$--;

Column 9, line 6, "$F_i$" should read --$F_1$--;

Column 11, line 59, "1 iM$^2$" should read --1im$^2$--;

Column 12, line 35, "|1>" should read --I1>--; and

Column 14, claim 11, line 7, "$F_2$" should read --$F_1$--.

Signed and Sealed this

Fifteenth Day of April, 2008

JON W. DUDAS
*Director of the United States Patent and Trademark Office*

UNITED STATES PATENT AND TRADEMARK OFFICE
CERTIFICATE OF CORRECTION

PATENT NO. : 6,838,694 B2
APPLICATION NO. : 10/244634
DATED : January 4, 2005
INVENTOR(S) : Daniel Esteve et al.

It is certified that error appears in the above-identified patent and that said Letters Patent is hereby corrected as shown below:

Column 5, line 35, "Ib" should read --$I_b$--;

Column 9, line 6, "$F_i$"," should read --$F_1$--;

Column 11, line 59, "1 $\mu M^2$" should read --$1 \mu m^2$--;

Column 12, line 35, "|1>" should read --I1>--; and

Column 14, claim 11, line 7, "$F_2$" should read --$F_1$--.

This certificate supersedes the Certificate of Correction issued April 15, 2008.

Signed and Sealed this

Sixteenth Day of September, 2008

JON W. DUDAS
*Director of the United States Patent and Trademark Office*